(12) United States Patent  
Chin et al.

(10) Patent No.: US 7,184,044 B2
(45) Date of Patent: Feb. 27, 2007

(54) ELECTRONIC DRAWING VIEWER

(75) Inventors: Rick Chin, Shrewsbury, MA (US); Ilya Baran, Newton, MA (US); Kevin Campanella, Shrewsbury, MA (US); John Sweeney, Acton, MA (US)

(73) Assignee: SolidWorks Corporation, Concord, MA (US)

( * ) Notice: Subject to any disclaimer, the term of this patent is extended or adjusted under 35 U.S.C. 154(b) by 307 days.

(21) Appl. No.: 10/446,579

(22) Filed: May 28, 2003

(65) Prior Publication Data

US 2003/0231214 A1    Dec. 18, 2003

Related U.S. Application Data

(62) Division of application No. 09/394,824, filed on Sep. 13, 1999.

(51) Int. Cl.
*G06T 15/00* (2006.01)

(52) U.S. Cl. ............... 345/427; 345/419; 345/420
(58) Field of Classification Search ............... 345/418, 345/419, 420, 427
See application file for complete search history.

(56) References Cited

U.S. PATENT DOCUMENTS 5,990,897 A * 11/1999 Hanratty .................. 345/420

\* cited by examiner

*Primary Examiner*—Phu K. Nguyen
(74) *Attorney, Agent, or Firm*—Victor Siber, Esq.; Clifford Chance US LLP

(57) ABSTRACT

Provided herein is a computer-based system for viewing a two-dimensional electronic drawing, including processes for pointing to similar components in different views, animation of views, hyperlinking components between views and virtual folding of an electronic drawing.

15 Claims, 17 Drawing Sheets

ELECTRONIC DRAWING VIEWER

This application is a divisional of U.S. patent application Ser. No. 09/394,824, filed Sep. 13, 1999.

BACKGROUND OF THE INVENTION

1. Field of the Invention

This application relates to the field of computer aided design and more particularly to the field of computer modeling.

2. Description of Related Art

Computer-aided design software can be used to construct and manipulate computer drawings of objects referred to as "models". The user is presented with a display of the model on the computer screen and manipulates the model using keyboard commands, a mouse/cursor combination, and other various input means. Changes to the model are reflected in the screen display of the model as the user makes the changes or, alternatively, in response to the user issuing a specific command to update the screen display of the model. In either case, the screen display of the model serves as the main source of model information to the user and as the user's reference for inputting and changing features of the model.

Although computer-aided design based on three-dimensional models has become increasingly prevalent, engineers and other designers continue to use conventional two-dimensional design drawings in many cases. Two-dimensional design drawings present a number of difficulties, one of which is that they are very difficult to read, even to experts. As two-dimensional renderings of different views of three-dimensional objects, the drawings necessarily separate relevant information about a unified object into a plurality of different views. This separation requires the user to understand the multiple views, rather than looking at the object as a whole. In addition, some views, such as section cuts, may not match any view that would actually be seen by a viewer of a real object, so that they require substantial imagination on the part of the user. As the complexity of a modeled object increases and as the number of views increases, it can be very difficult to keep track of the relationship of different views and of the relationship of different components within different views.

Despite these problems, two-dimensional drawings remain a standard modeling technique for a wide range of objects in many fields. Accordingly, a need exists for simplifying computer modeling of two-dimensional drawings.

SUMMARY OF THE INVENTION

According to the present invention, correlating at least two views of an object, includes providing a data structure that links first geometry of a first one of the view with a second one of the view and, in response to a user selecting the first geometry, indicating a correlation between the first geometry and the second one of the views. Indicating may include highlighting the second one of the views. In response to the second one of the views not being visible on a user screen, the second one of the views may be displayed on the user screen. The first geometry may include a section line and/or a detail circle. The data structure that links the first geometry to the second one of the views may be derived from underlying three dimensional model data from which the at least two views are generated. Selecting the first geometry may include locating a cursor arrow on the first geometry and clicking a mouse button.

According further to the present invention, displaying two views of an object, includes selecting a first one of the views, selecting a second one of the views, and moving at least one of the views so that the first view is in proximity to the second view. If the first view is a projection of the second view, moving at least one of the views may include snapping the views into alignment. Aligning the first and second views may include using transform matrices associated with each of the views. The transform matrices may correlate relative coordinates of each of the views with an absolute coordinate system. Selecting the first view and selecting the second view may include locating a cursor arrow on the views and clicking a mouse button. Selecting the first view and selecting the second view may include dragging and dropping at least one of the views into closer proximity with the other one of the views.

According further to the present invention, correlating at least two views of an object includes providing a pointer having an absolute location, displaying the pointer in a first one of the views at a relative location in the first view corresponding to the absolute location of the pointer, and displaying the pointer in a second one of the views at a relative location in the second view corresponding to the absolute location of the pointer. The relative locations may be determined by applying a transform matrix for each of the views to the absolute location of the pointer. In response to the user moving the pointer in the first one of the views, the pointer may be moved a corresponding amount in the second one of the view. The user moving the pointer may include dragging and dropping the pointer in one of the views. A new absolute location of the pointer may be determined by applying an inverse of a transform matrix for the first one of the views to determine a new absolute location of the pointer based on movement of the pointer by the user in the first one of the views. A new relative location for the pointer in the second view may be determined by applying the transform matrix for the second one of the views to the new absolute location of the pointer.

According further to the present invention, displaying a model having a plurality of two dimensional views associated therewith includes rotating the model to present a first one of the views, pausing to show the first one of the views, and continuously rotating and pausing the model to present other ones of the views. In response to a user indicating that rotation should stop, rotation may be suspended until the user indicates otherwise. After the user has indicated that rotation should stop at a first particular one of the views, a correlation between a first geometry of the first particular one of the views and a second particular one of the views may be indicated. Indicating may include highlighting the second particular one of the views. In response to the second particular one of the views not being visible on a user screen, the second particular one of the views may be displayed on the user screen. The first geometry may includes a section line and/or a detail circle. After indicating a correlation between a first geometry of the first particular one of the views and a second particular one of the views, the model may be rotated to present the second particular one of the views. In response to a presented view being a section view, a portion of the model may be removed to show the view.

According further to the present invention, a computer-based system for providing interpretation of a two-dimensional electronic drawing having a plurality of views, includes a virtual folding process for permitting a viewer to view selected views in proximity to each other from a plurality of the possible views, a hyperlink process for simultaneously highlighting the coordinates of a viewed object as the coordinates appear in more than one view, a pointer for simultaneously pointing to the same point of a viewed object as the point appears in more than one view, and a drawing animator for rotating the three-dimensional depiction about an axis of rotation and highlighting a two-dimensional view when the view is coincident with the plane of the drawing. Data for the two dimensional drawing and a program for displaying the drawing may be stored in a single file.

DETAILED DESCRIPTION OF THE PREFERRED EMBODIMENT(s)

Figure 1:
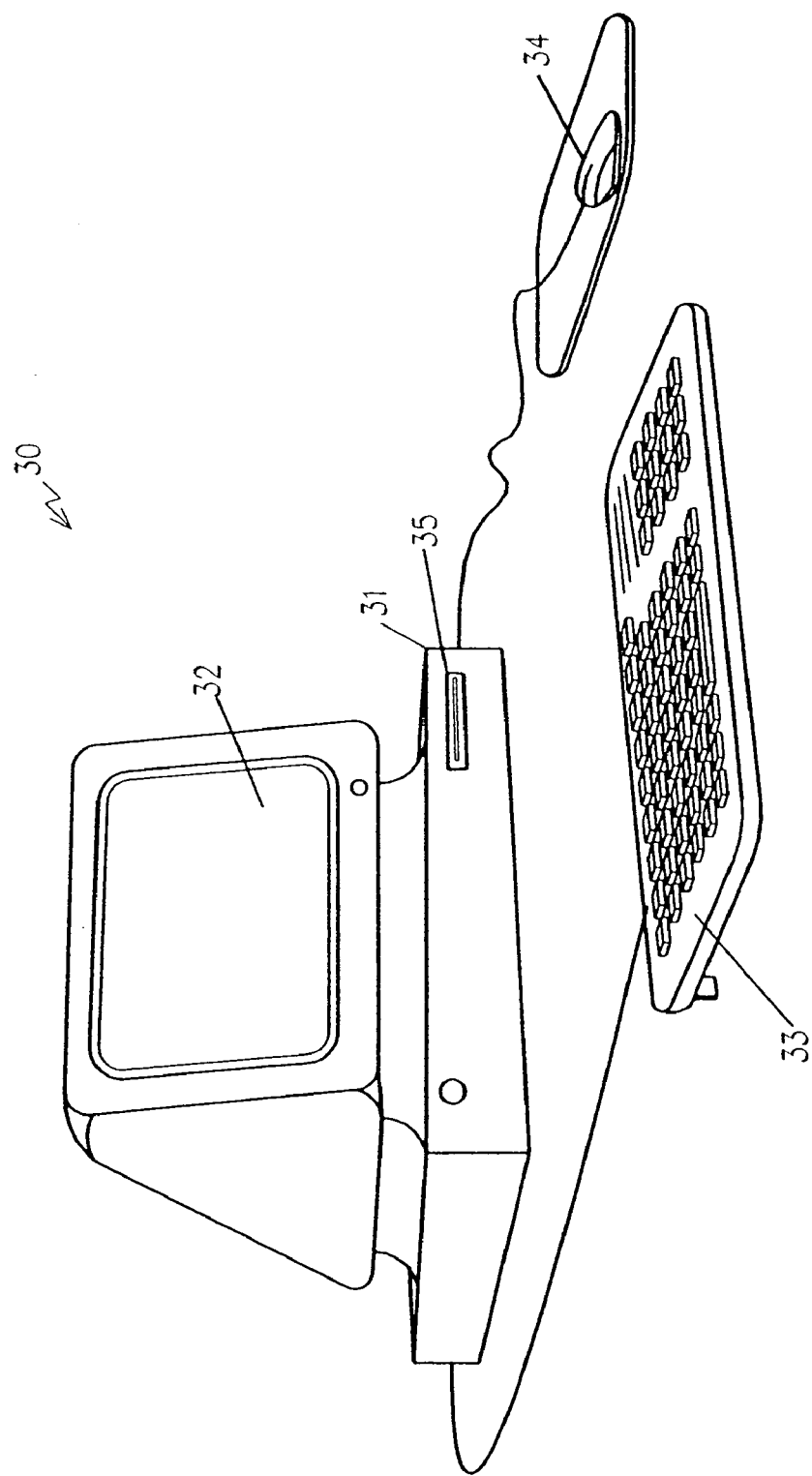
FIG. 1 depicts the system components of a computer modeling system.

Referring to FIG. 1, a computerized modeling system 30 includes a CPU 31, a computer screen 32, a keyboard input device 33, a mouse input device 34, and a storage device 35. The CPU 31, computer screen 32, keyboard 33, mouse 34, and storage device 35 are conventional, commonly available, computer hardware devices such as a workstation or personal computer employing a microprocessor, such as a Pentium- or Pentium-II based processor or other conventional processor. The mouse 34 has conventional, user-actuatable, left and right buttons. Other appropriate computer hardware platforms are suitable as will become apparent from the discussion which follows. Such computer hardware platforms are preferably capable of operating a software operating system capable of a graphical user interface, such as the Microsoft Windows NT, Windows 95, or Windows 98 operating systems, or a MacIntosh operating system from Apple Computer.

Computer-aided design software is stored on the storage device 35 and is loaded into and executed by the CPU 31. The software allows the user to create and modify a model of an object.

Figure 2:
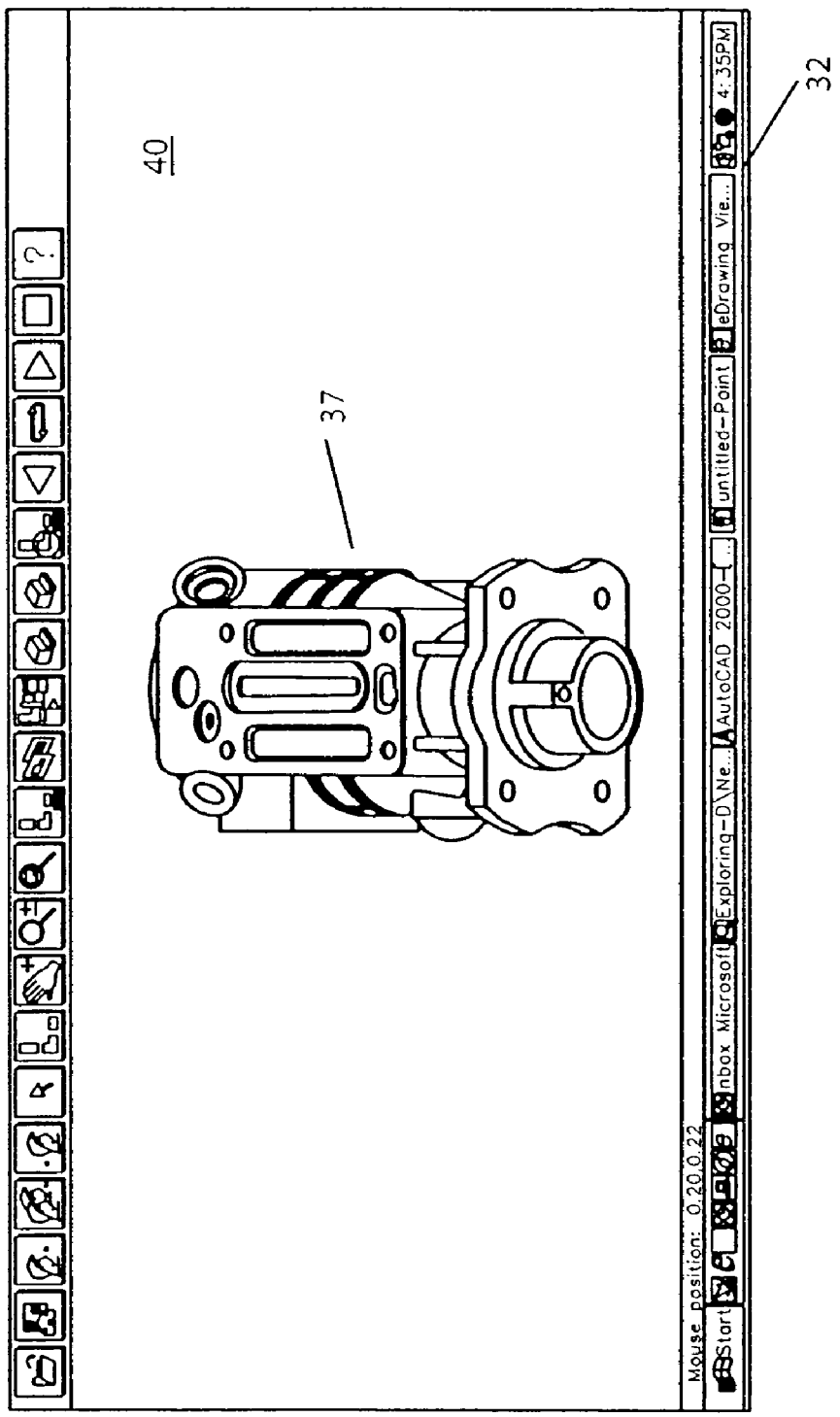
FIG. 2 depicts a computer screen with a modeling window for displaying an object to be viewed.

Referring to FIG. 2, the CPU 31 uses the computer screen 32 to display a three-dimensional model in a modeling window 40. The object depicted in FIG. 2 is a three-dimensional rendering of a common mechanical object, the housing 37 for a pump. Other aspects thereof are described in more detail below.

Referring again to FIG. 1, a user actuates the keyboard 33 and the mouse 34 to enter and modify data for the model. The CPU 31 accepts and processes input from the keyboard 33 and the mouse 34. Using the modeling software, the CPU 31 processes the input along with the data associated with the model and makes corresponding and appropriate changes to the display on the computer screen 32. In addition, data corresponding to the model created by the user can be written from the CPU 31 to the storage device 35. It will be appreciated by those of ordinary skill in the art that the invention could be used in conjunction with any computer-aided design software, including software used to generate three-dimensional or two-dimensional models, such as modeling software provided by SolidWorks Corporation of Concord, Mass.

Figure 3:
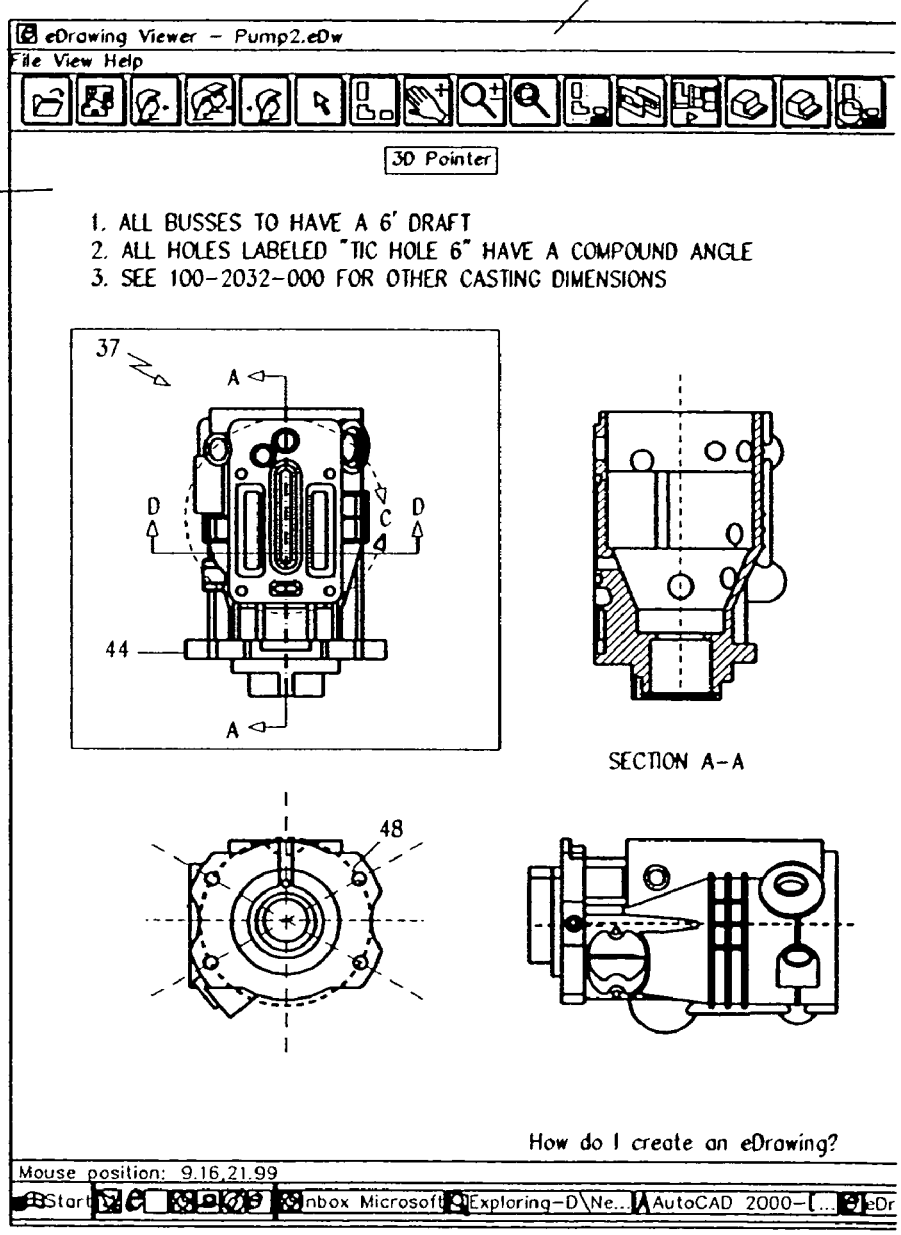
FIGS. 3 and 4 depict a plurality of views of an example of a design drawing in a modeling window of a computer system such as that of FIG. 1.
Figure 4:
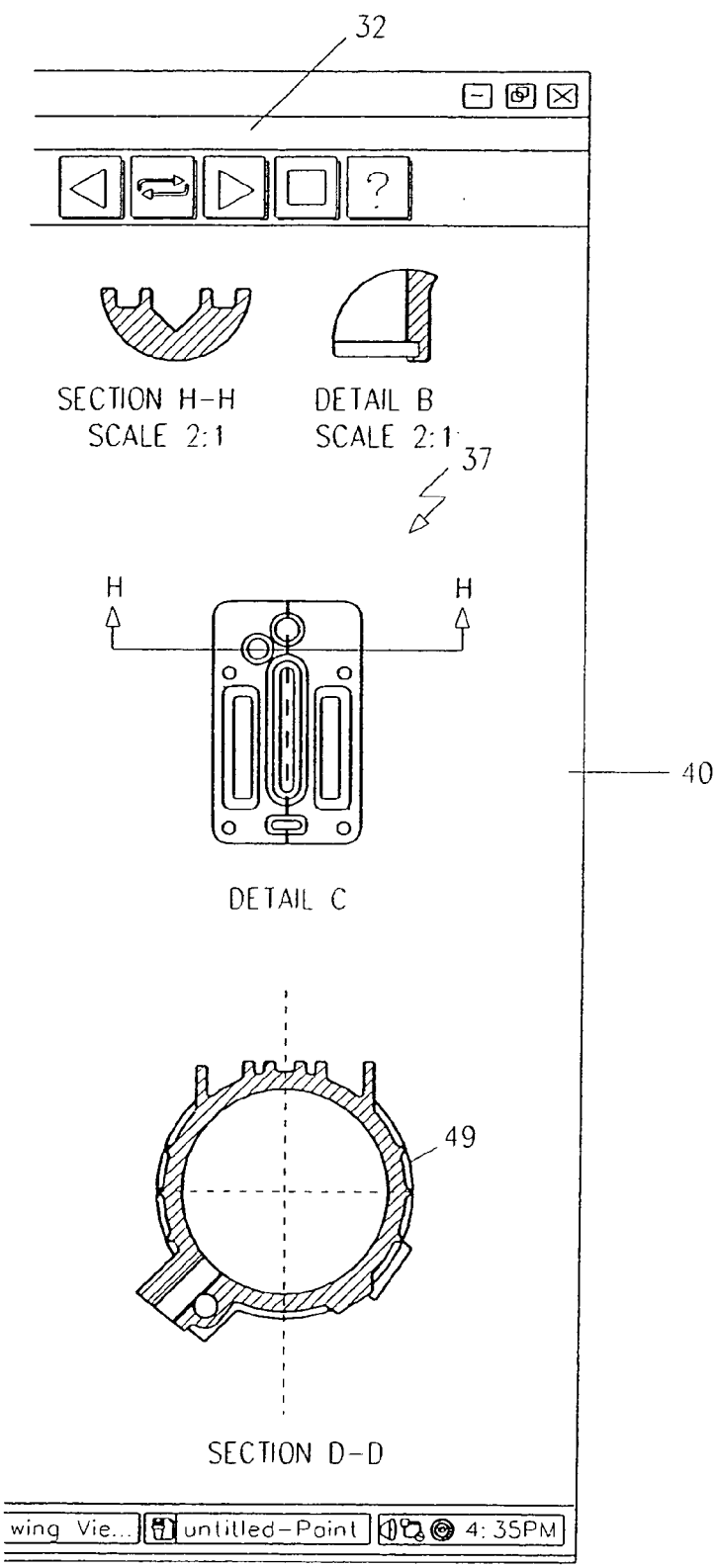

Referring to FIGS. 3 and 4, a two-dimensional design drawing is depicted, showing a number of two-dimensional views of, in this example, the pump housing 37 of FIG. 2. The computer screen 32 includes the modeling window 40 that contains a number of views of the pump housing 37. Different views include a front view 44, a top view 48, a number of section views, and a detail view. As can be observed from the drawing of FIGS. 3 and 4, a drawing even for a simple mechanical device such as a pump housing is very complex, making it quite difficult to read. For example, the level of detail requires that the model be sufficiently large to read the dimensional data, but the number of views makes it difficult to fit all views of a sufficiently large size on a single screen. As a result, the computer screen 32 typically only shows part of the modeling window 40 at any given time, requiring the user to use a process, such as an arrow bar or other conventional device (not shown) to move about the modeling window 40 among the different views.

Figure 5:
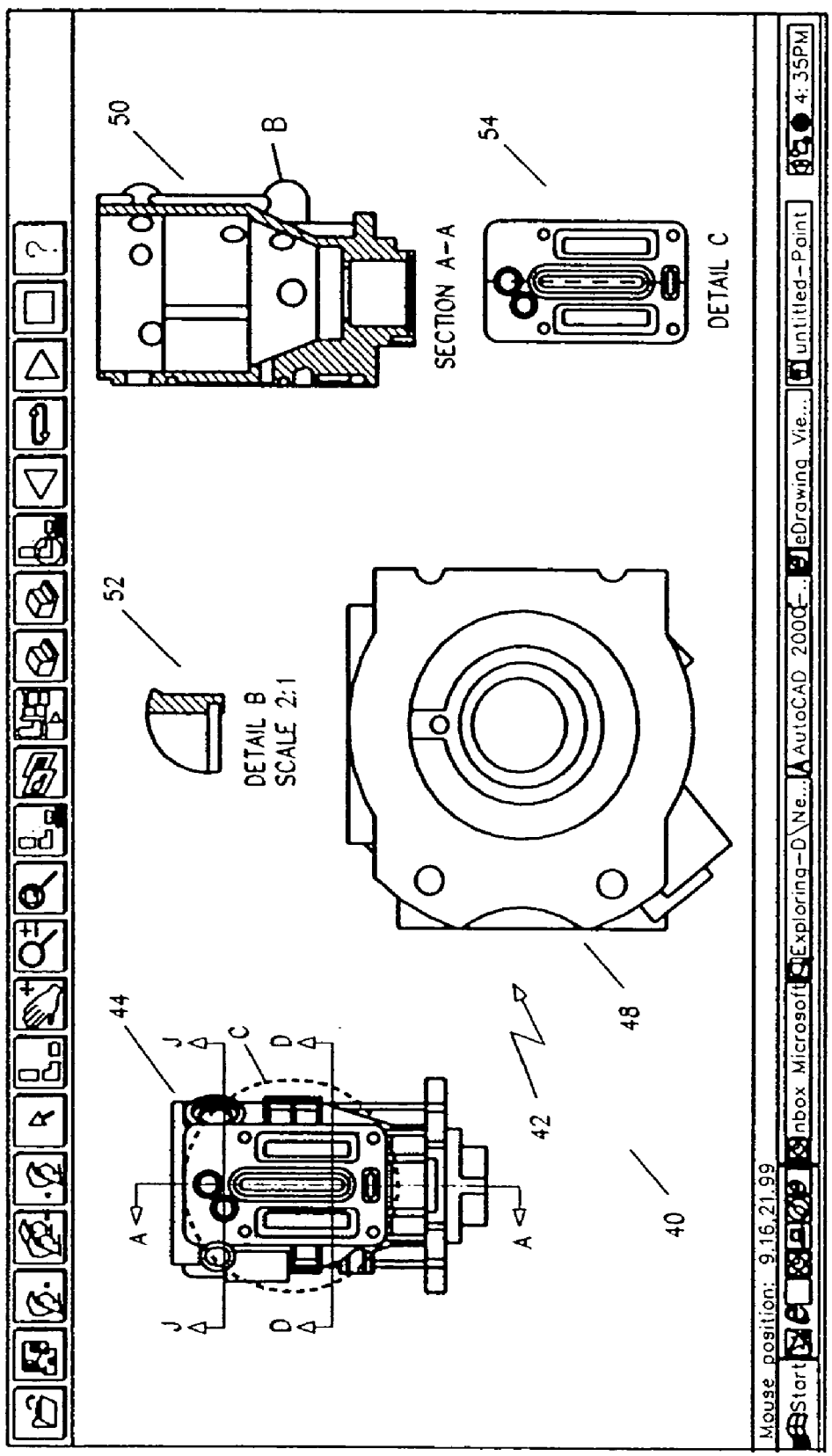
FIG. 5 depicts a simplified schematic of a design drawing in the modeling window of a computer screen.

A simplified schematic of typical design drawings, such as those of FIGS. 3 and 4, is depicted in FIG. 5, containing a reduced level of design detail as needed to illustrate the methods and systems disclosed herein. In FIG. 5 certain shading and background elements have been included that would not necessarily appear on the computer screen 32, but that enhance the ability to view elements discussed below.

Referring to FIG. 5, in one embodiment, a model 42 consists of a plurality of two-dimensional views of a pump housing object, such as the front view 44, the top view 48, a section view 50, a first detail view 52 and a second detail view 54. Section view 50 is a two-dimensional view of a cross section that one would obtain by cutting the object depicted in front view 44 along the line A—A that is depicted in the front view 44. It should be noted that a side view can be obtained by taking a section view while placing the section line adjacent to, rather than through, an object to be viewed. Top view 48 depicts the view that one would obtain by looking at the top of the object depicted in the front view 44, with the top of the object being positioned at the top of the computer screen 32. Detail view 52 is a depiction of a more detailed element B as indicated in the section view 50. Detail view 54 is a more detailed view of the circled item C of the front view 44.

Figure 6:
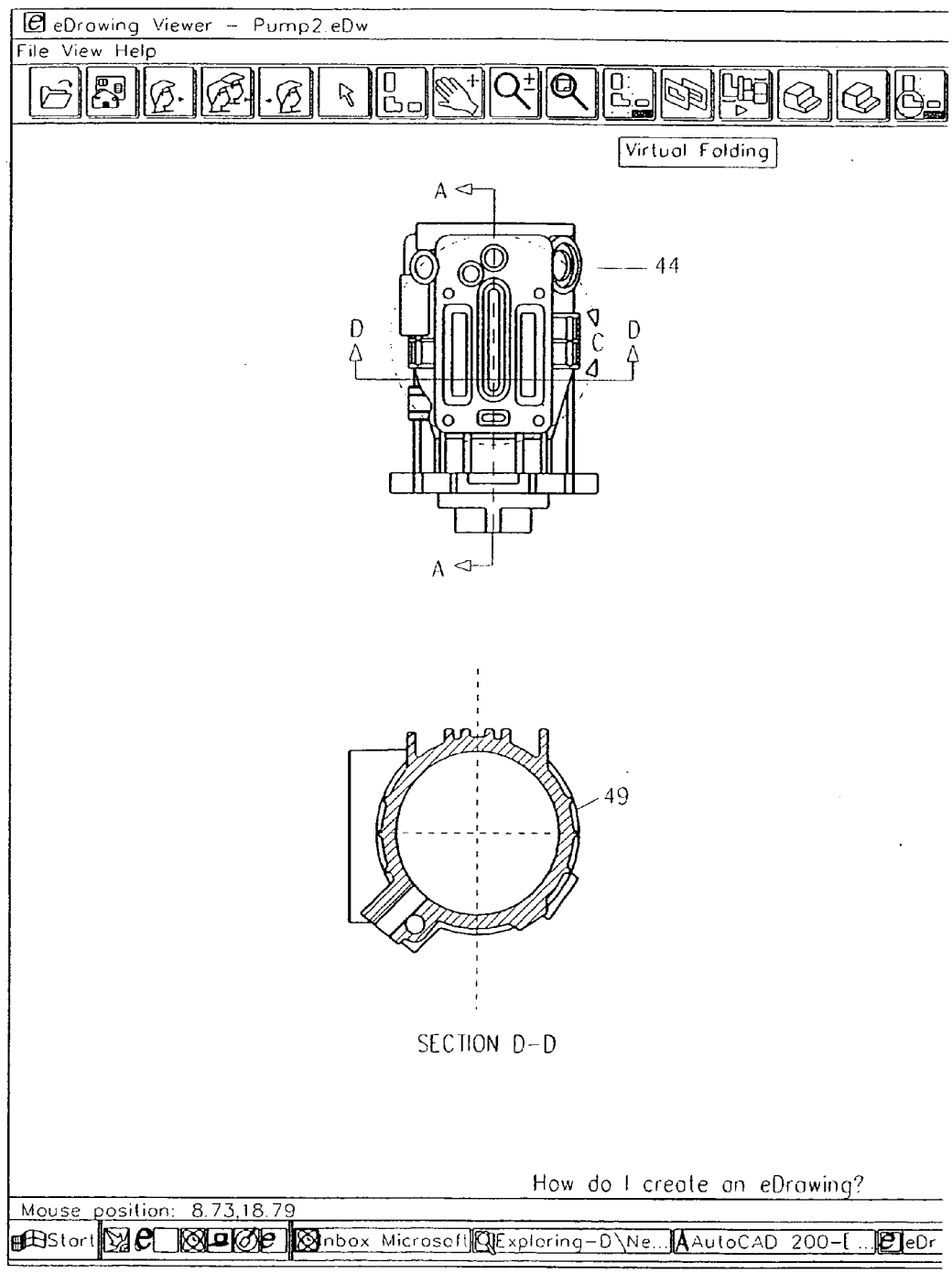
FIG. 6 depicts the front view of FIG. 3 and a section view of FIG. 4 after completion of a virtual folding process of the present systems and methods.

Provided herein is a computer-based system for providing improved viewing of a two-dimensional electronic drawing having a plurality of views. Referring to FIGS. 3, 4 and 6, the computer-based system includes a virtual folding process for permitting a viewer to place selected views from a plurality of possible views in proximity to each other on the computer screen. FIG. 3 depicts a schematic of a model 42 with the front view 44 in the computer screen 32. FIG. 4 depicts section view D—D, which is a section that would result upon cutting the pump housing 37 along axis D—D. Thus, while the front view 44 and the section view 49 are in the same computer screen 32, they are sufficiently distant from each other that it is difficult to view both of them on the computer screen 32 at the same time while maintaining a sufficiently close view to see important details, such as dimensional data.

The situation depicted in FIGS. 3 and 4 is analogous to a situation that arises with two-dimensional drawings in paper form, such as those used by architects or mechanical engineers. Different views are often located far apart on the paper, so that it is difficult to examine two related views at the same time. The conventional method for handling a large paper drawing is to fold the drawing so that items of interest are in close proximity to each other, with other items hidden by the fold in the drawing.

The methods and systems disclosed herein provide a virtual folding process that permits the user to place selected views near each other on the screen, while hiding views that are not selected. Thus, the virtual folding process permits the user to select the front view 44 and the section view 49, and to move the two views into proximity of each other, as depicted in FIG. 6. Execution of a virtual folding process may be executed by any conventional mechanism, such as a pull-down menu, an icon, a mouse operation, or the like. For example, a user might select a virtual folding process from a library of tools by clicking on a tools menu bar at the top of the computer screen 32. The user could then select views among those on the computer screen 32 by locating the cursor arrow on a particular view and clicking one of the buttons of the mouse. Alternatively, the virtual folding process could involve dragging and dropping a selected view into closer proximity with another view. Further details as to the virtual folding process are provided below.

Figure 7:
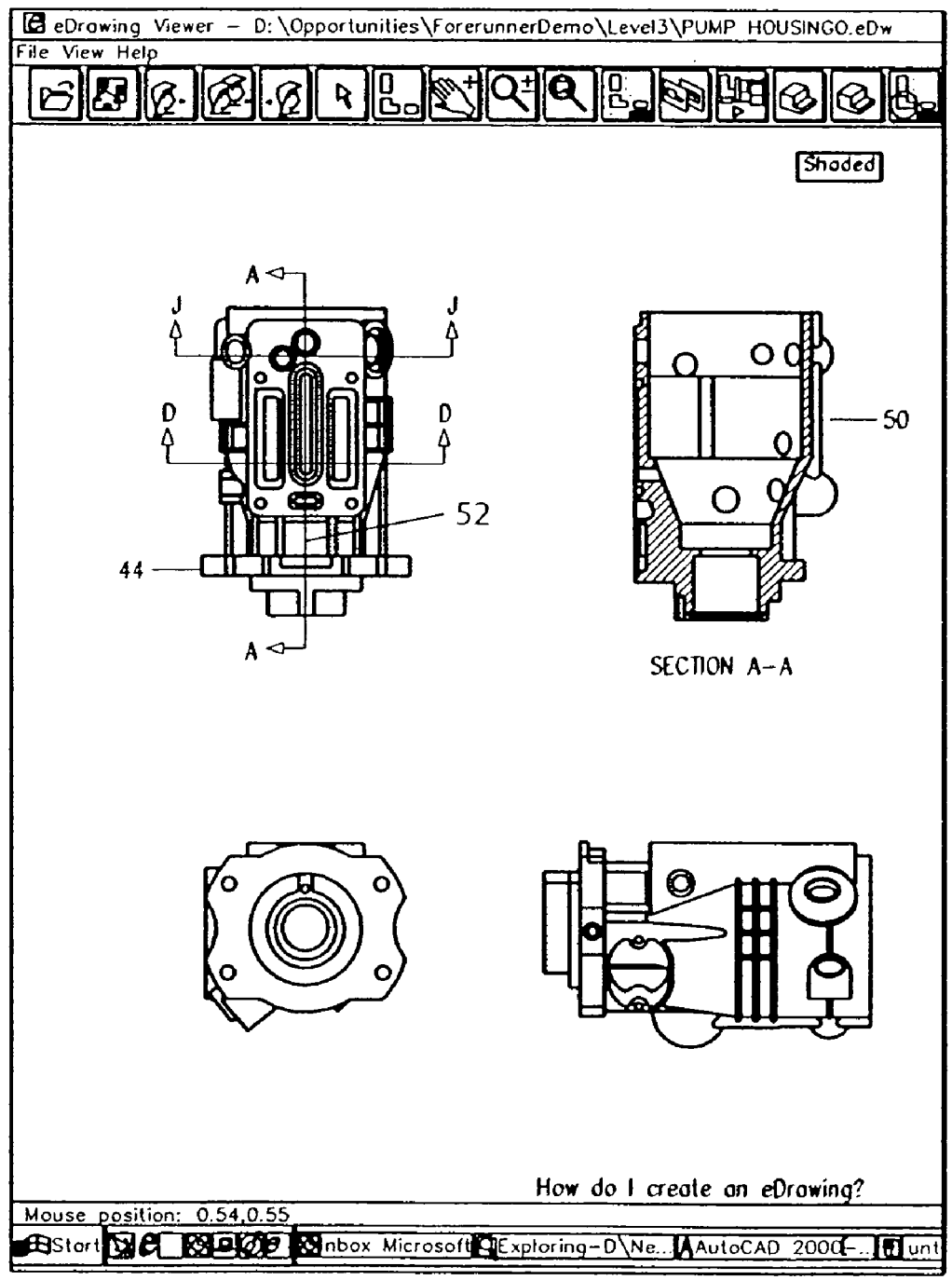
FIG. 7 depicts views of an object in a modeling window of a computer screen for illustrating a hyperlink process of the present systems and methods.

Also provided herein as a part of the computer-based system is a hyperlink process for simultaneously highlighting the coordinates of a viewed object and a corresponding other view on a computer screen. Referring to FIG. 7, the front view 44 and the section view 50 include the coordinates A—A, representing the location of a cut through the object modeled in the model window 40 of the computer screen 32. The hyperlink process identifies coordinates and the respective views that appear in the computer screen 32 and, when the cursor is positioned over a particular coordinate, the corresponding view is highlighted. For example, if the mouse is positioned over the coordinates A—A in the front view 44 at the location 52, then the section view 50 is also highlighted. Highlighting may be accomplished by changing the color, by using shading, or other conventional methods for highlighting an item of interest on a computer screen 32.

Figure 8:
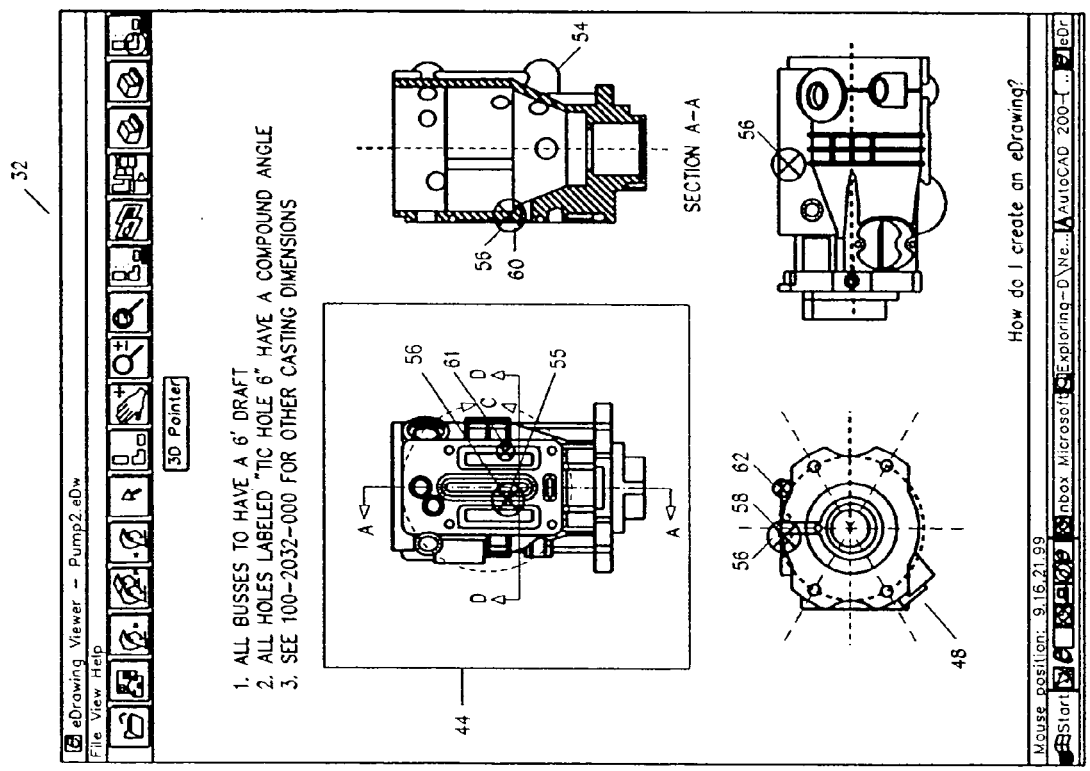
FIG. 8 depicts an object in a modeling window of a computer screen for illustrating a pointer process of the present systems and methods.

Also provided as a part of the computer-based system is a pointer for simultaneously pointing to the same point of a viewed object as the point appears in more than one view on a computer screen. Referring to FIG. 8, a pointer 56 may appear in one or more views of an object modeled in the modeling window 40 of the computer screen 32. For example, the pointer 56 may be located at the location 55 in the front view 44, which corresponds to the location 58 in the top view 48 and the location 60 in the detail view 54. When the pointer 56 is moved, such as by clicking and holding the mouse on the pointer 56, the pointer 56 moves in each of the views to a location that corresponds in each of the views. For example, if the pointer 56 is moved along a horizontal line in the view 44 to a location 61, then the pointer 56 in the top view 48 would move to a new location 62 in the section view 54. Similarly, the pointer 56 could move to a new location in the section view 54, but in this case, because the movement is along the axis of sight of the viewer, no movement would be apparent. Depending on the relationship of the views, the pointer 56 might move quite differently in different view. For example, if views are skewed with respect to each other, then horizontal movement in one view might not result in any movement of the pointer in another view, because the horizontal movement might be along an axis of viewing in one of the views. The pointer process permits quick recognition of similar components in different views. A pointer may highlight a spot through color, shading, or other conventional means. Crosshairs are depicted in FIG. 8 as an example of a pointer.

Figure 9:
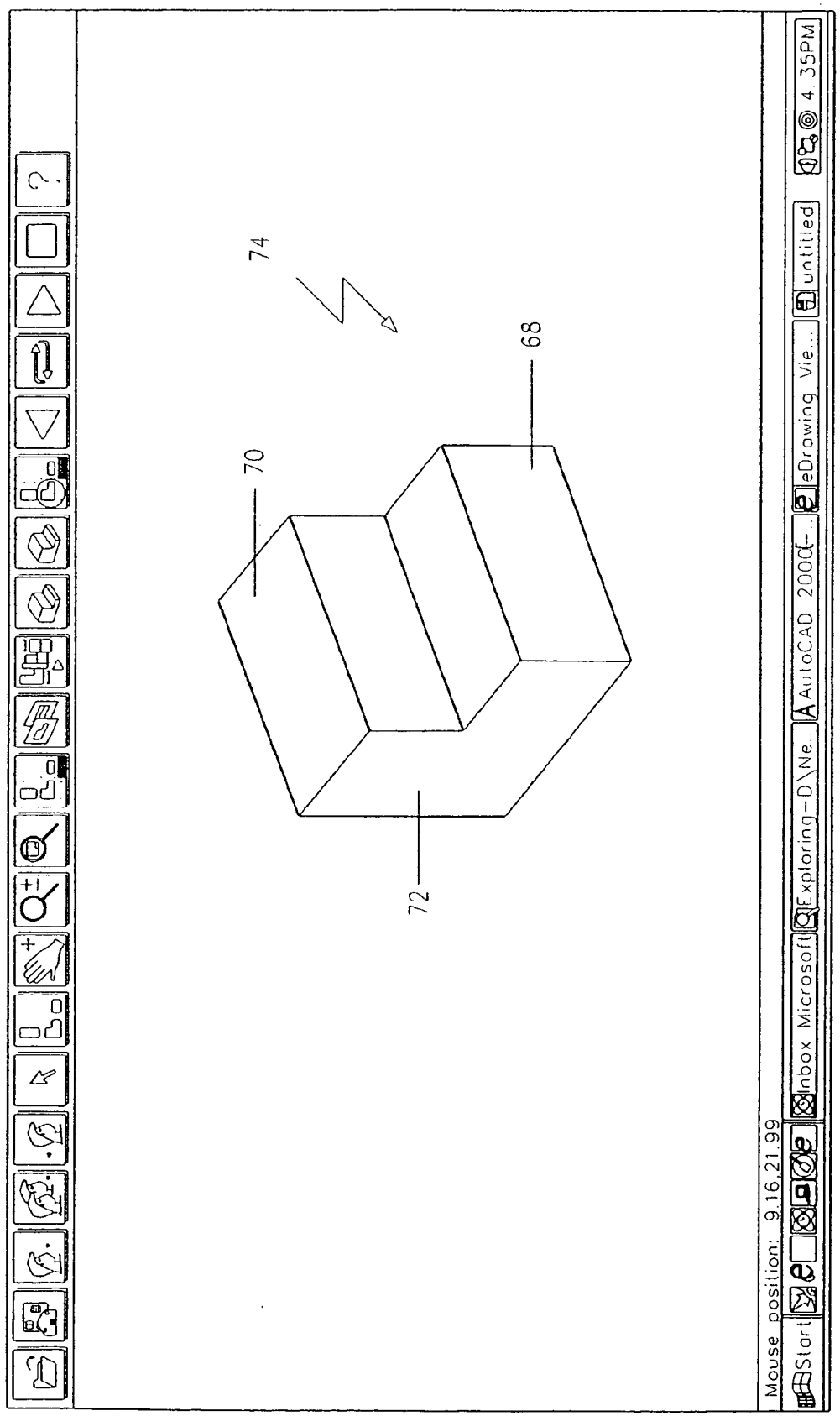
FIG. 9 depicts a simplified solid object in a modeling window of a computer screen.

Also provided herein as part of the computer-based system is a drawing animator for rotating a three-dimensional depiction of a model about an axis of rotation and highlighting a two-dimensional view when the view is coincident with the plane of the drawing. Referring to FIG. 9, a simplified solid object is depicted in the modeling window 40 of the computer screen 32. Methods and systems for rotating such an object about one or more axes of rotation are well known in the area of computer-aided design, such as those provided in the Solid Works 99 product available from SolidWorks Corporation of Concord, Mass. In an animator process that is associated with a two-dimensional drawing having a plurality of views, the process may highlight a view when it is presented to the user. For example, referring to FIG. 9, a simple step 74 is depicted having a front side 68, and top side 70 and a right side 72. The step 74 is presented in FIG. 9 as partially rotated to show these three sides, with shading representing the different sides.

Figure 10:
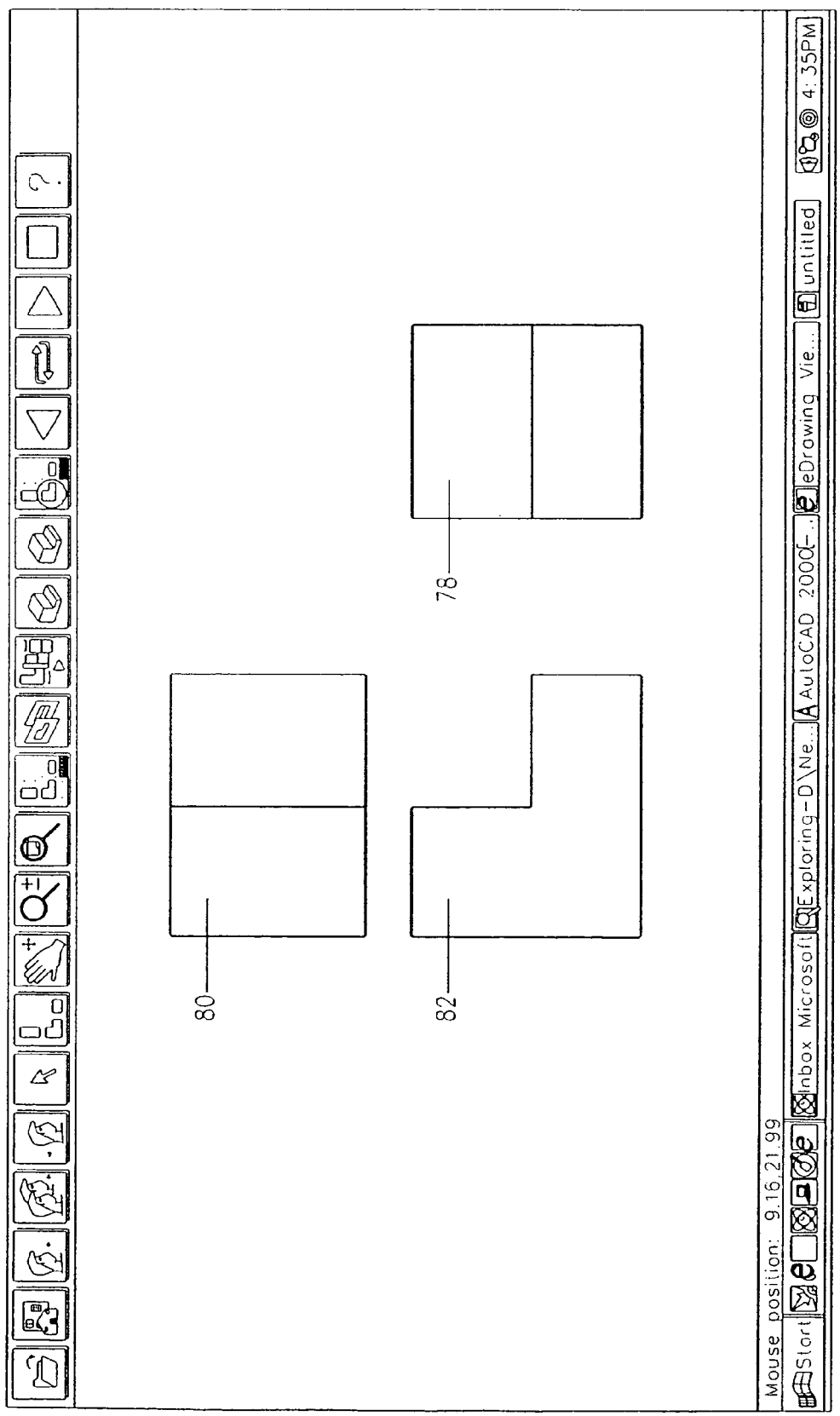
FIG. 10 depicts a schematic diagram with three two-dimensional views of the object of FIG. 9.

FIG. 10 depicts a two-dimensional drawing showing a front side view 78, and top side view 80 and a right side view 82, corresponding to a two-dimensional view of each of the sides of the step 74.

Figure 11:
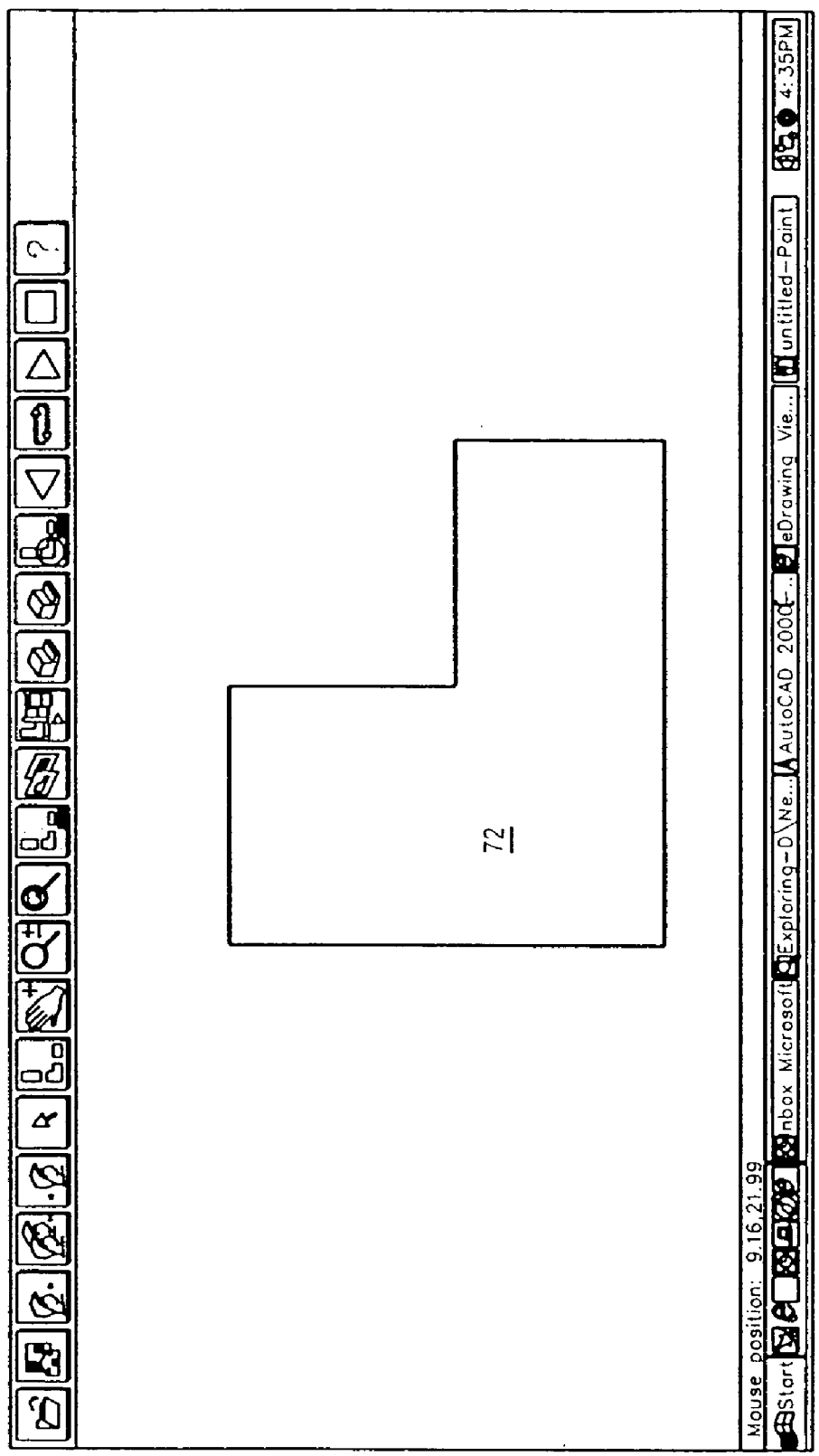
FIG. 11 depicts a single highlighted view after rotation of the object of FIG. 9.

Referring to FIG. 11, when the step 74 is rotated by the modeling program, a particular view is highlighted when it is presented directly to the user; i.e., when the side is co-planar with the computer screen and perpendicular to the line of sight of the viewer of the computer screen 32. Thus, the front side view 78, the top side view 80 and the right side view 82 are highlighted when the rotation presents them to the user. FIG. 11 depicts the right side view 72 after rotation of the step to the right from the position of FIG. 9. The animation feature enables the user to recognize the location of various views when they appear in the object. When an object has complicated cross sections, the animation permits the user to determine the orientation of various two-dimensional views relative to each other.

Figure 12:
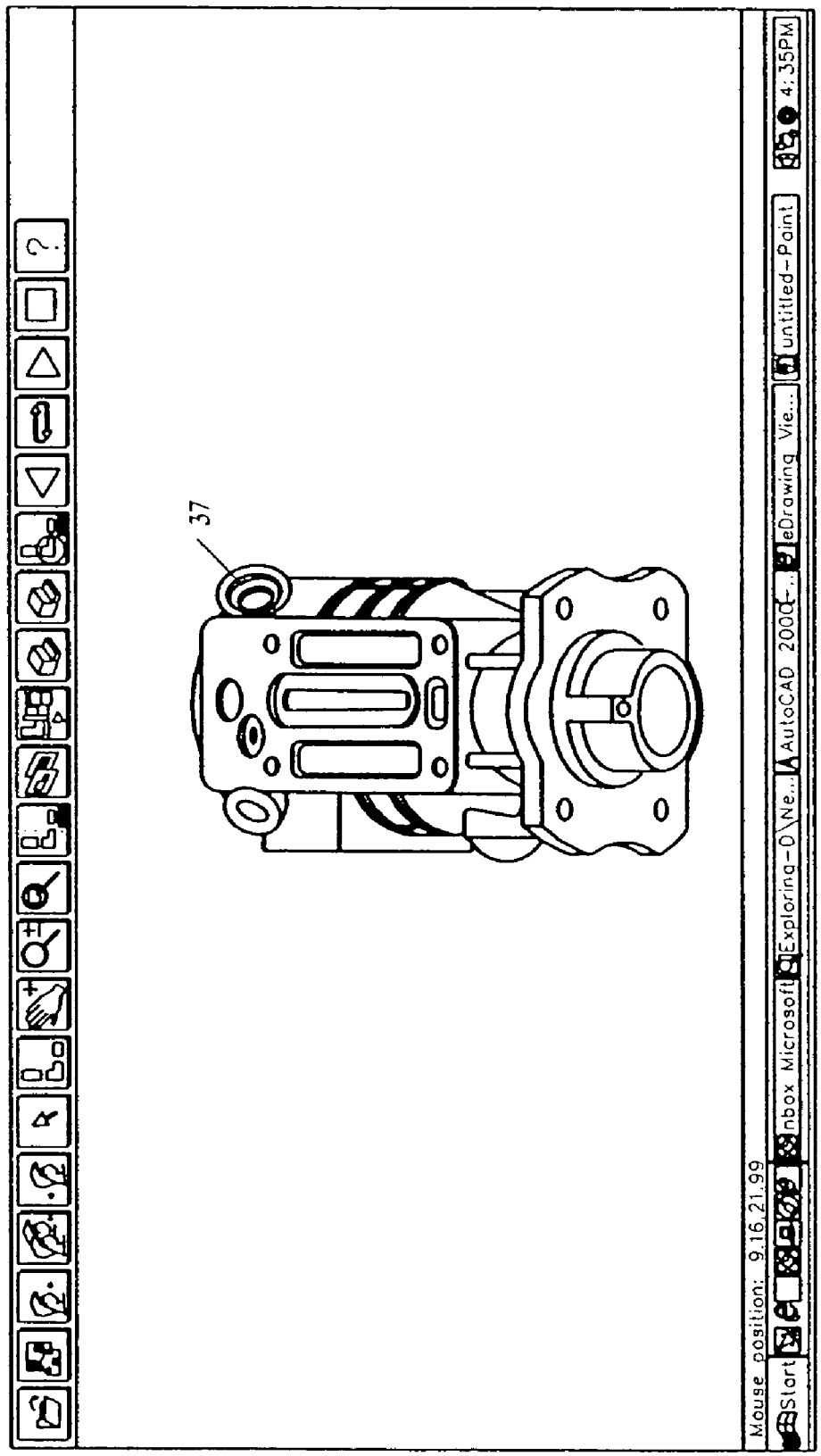
FIGS. 12 and 13 present, respectively, a three-dimensional view of a pump housing during rotation and a two-dimensional view highlighted according to the process of the present invention.
Figure 13:
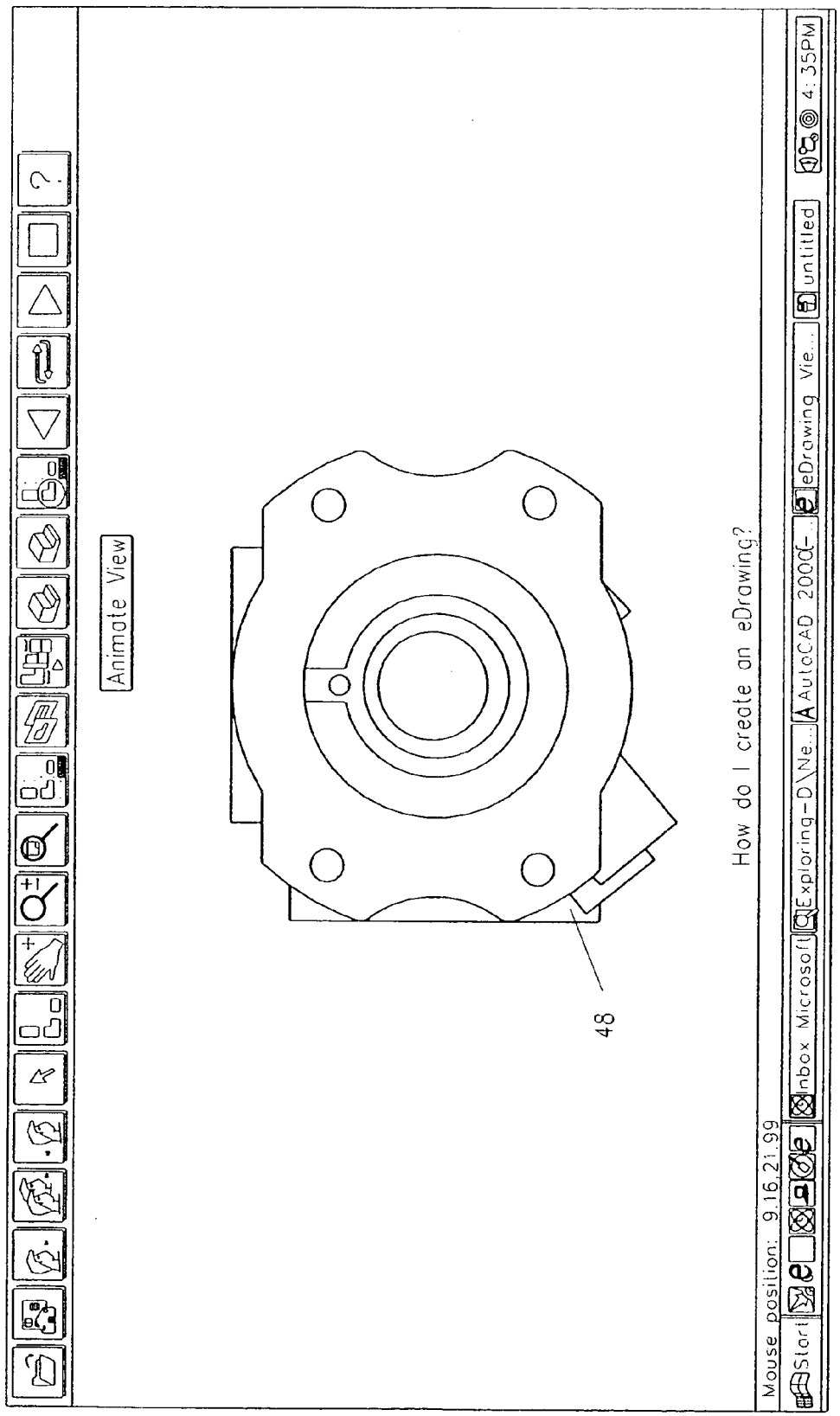

FIGS. 12 and 13 present, respectively, a three-dimensional view of a pump housing 37 during rotation and a two-dimensional view highlighted according to the process of the present invention. Specifically, FIG. 13 represents a top view 48 that would be highlighted when the pump housing 37 is rotated so that the top side faces the viewer of the computer screen 32.

Figure 14:
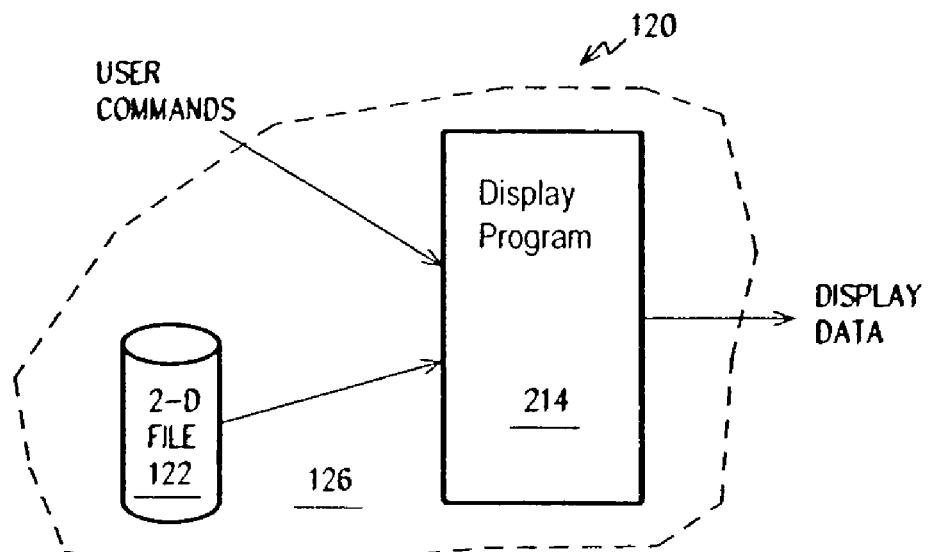
FIG. 14 depicts a system for providing the functionality of the systems and methods disclosed herein, including an electronic drawing file and a display program.

Referring to FIG. 14, a system 120 for providing the functionality discussed above and shown in FIGS. 1–13 includes an electronic drawing file 122 and a display program 124. The display program 124 uses the electronic drawing file 122 and user commands to provide display data that may be shown on the computer screen 32 or printed out in a conventional manner. The electronic drawing file 122 and the display program 124 are discussed in more detail hereinafter.

In one embodiment, the electronic drawing file 122 and the display program 124 are stored together in a compressed metafile 126. The single compressed metafile 126 may then be provided to a user as a single file that, when uncompressed, includes both the display program 124 and the electronic drawing file 122. If the display program 124 is not too large, then it may be possible to send a substantial number of electronic drawings this way so that the recipient(s) always have the display program 124 for displaying the electronic drawing file 122. Compressing the electronic drawing file 122 and the display program 124 into a single compressed file 126 may be performed in any one of a number of conventional fashions using conventional software available for such purposes. In some instances, execution of the single compressed metafile 126 will cause automatic decompression and execution of the display program 124.

Figure 15:
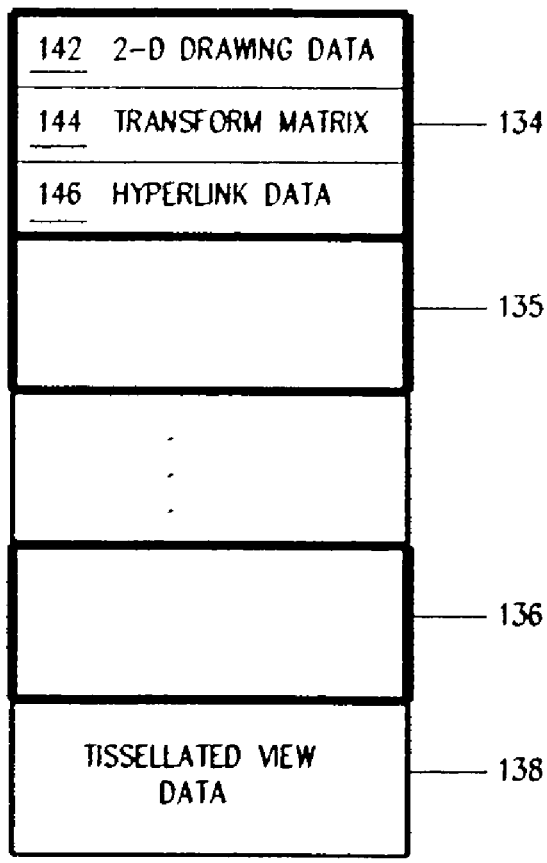
FIG. 15 depicts an electronic drawing file according to the present invention.

Referring to FIG. 15, the electronic drawing file 122 is shown as including a plurality of view data records 134–136 and a tessellated model data record 138. The view data record 134, which is shown in detail, includes two-dimensional drawing data 142, a transform matrix 144 and hyperlink data 146. Other view records 135 and 136 contain data analogous to that shown in detail for the view record 134. The tessellated model data record 138 includes data corresponding to a three-dimensional tessellated view that is generated in a conventional manner from the three-dimensional model in a manner described in more detail hereinafter in connection with the discussion regarding generation of the electronic drawing file 122.

Each of the view records 134–136 corresponds to one of the two-dimensional views, including views corresponding to section cuts and detail circles. The two-dimensional data 142 includes conventional two-dimensional drawing objects used to display the view corresponding to the record 134. These objects include commands to draw lines, circles, arcs, etc. Each of the view records 134–136 includes corresponding two-dimensional data for the corresponding view.

Associated with the model represented by the various view records 134–136 is an absolute base coordinate system that includes the orientation, translation, and scaling factor for the model as depicted by the various view records 134–136. Accordingly, the transform matrix 144 includes information indicating the translation, scale, and rotation of the view record 134 with respect to the absolute base for the model represented by the view records 134–136. As is known in the art, the transform matrix is a four-by-four array that contains specific numbers indicating the translation, scale, and rotation. A discussion of such transformation matrices may be found in *Computer Graphics Principles and Practice*, by Foley, VanDam, Feiner, and Hughes, published by Addison-Wesley, of New York, N.Y.

The hyperlink data 146 contains data that links portions of the two-dimensional data 142 of some of the records 134–136 with other ones of the records. In the case of a section view, the hyperlink data 146 would contain an identification of the particular section line stored in the two-dimensional data 142 and associate that information with another one of the views 135 and/or 136 that corresponds to the particular section line in the two-dimensional data 142. Similarly, for detail circles, the hyperlink data 146 would identify a particular item or items of the two-dimensional data 142 that shows the circle in the view corresponding to the record 134 and links that information with another one of the views 135 and/or 136 that corresponds to the detail circle. Generation of the hyperlink data 146 is discussed in more detail hereinafter in connection with the discussion regarding generation of the electronic drawing file 122.

Figure 16:
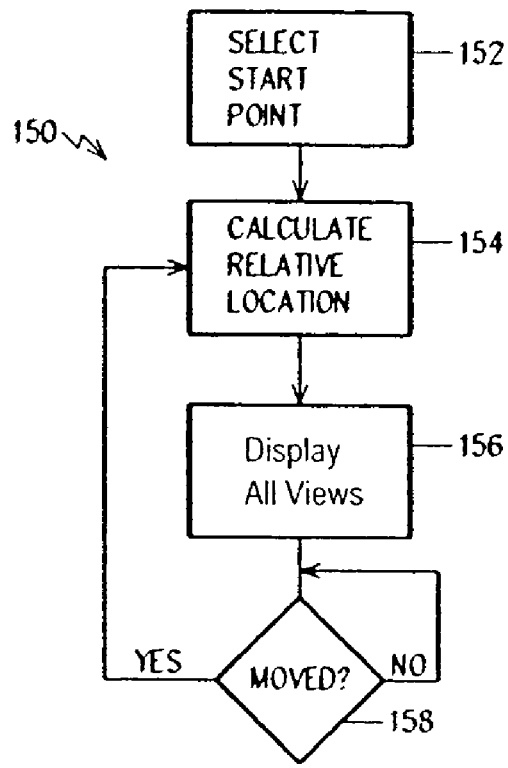
FIG. 16 is a flow chart illustrating steps used in connection with implementing the pointer process disclosed in connection with FIG. 10.

Referring to FIG. 16, a flow chart 150 illustrates steps used in connection with implementing the pointer 56. At a first step 152, a start point for the pointer 56 is selected. The start point for the pointer could be any point in three-dimensional space, such as the origin of the absolute coordinate system. However, in one embodiment, the start point may be chosen by selecting a visible point on a displayed view for two of the three coordinates and then using that point to calculate the third coordinate corresponding to a visible point on a second, orthogonal view to the first selected view.

Following the step 152 is a step 154 where the location of the pointer 56 is calculated for all of the views. The location of the pointer 56 is stored as three values corresponding to the X, Y, and Z coordinates, in the absolute coordinate system. Accordingly, at the step 154, the relative location of the pointer 56 for each of the views is determined by using the transform matrix associated with each view and applying the transform matrix to the absolute coordinates of the pointer 56. Thus, at the step 154, application of the transform matrix to the absolute coordinates of the pointer 56 provides a relative position of the pointer 56 for each of the views. Following the step 154 is a step 156 where the pointer 56 is displayed in all of the views of a modeling window 40 of the computer screen 32. Displaying the pointer 56 at the step 156 is provided in the conventional manner, by using the relative location information determined at the step 154 and providing an appropriate symbol, such as a dot or a crosshair, on each of the views to indicate the location of the pointer 56 in each of the views. In some embodiments, the pointer 56 may be provided in a different color than the drawing portion of the views.

Following the step 156 is a test step 158 that determines whether the pointer 56 is moved by the user. Note that the user may move the pointer 56 in any one of the views where the pointer 56 is visible. Movement is accomplished in a conventional manner, such as by using the mouse to drag the pointer 56 in one of the views. If it is determined at the step 158 that the user has moved the pointer 56, then control transfers back to the step 154 where the location of the pointer 56 is recalculated in each view, using the transform matrices and other steps indicated in connection with the discussion of the step 154 above. Thus, if the user chooses to move the pointer 56 in a particular view, then the absolute location of the pointer 56 may be calculated by first applying the inverse transform matrix for that view to the relative position of the pointer 56 in the view to provide an absolute location of the pointer 56. Once the absolute location of the pointer 56 is known, then it is possible to apply the transform matrix for each view to determine the relative position of the pointer 56 in each view as discussed above.

Figure 17:
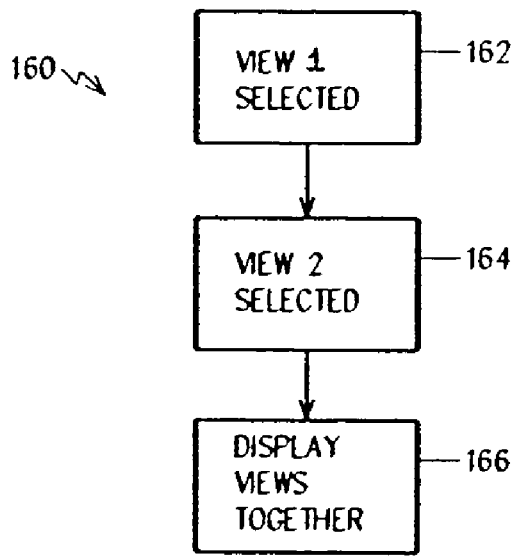
FIG. 17 is a flow chart indicating the steps for implementing the virtual folding feature described in connection with FIGS. 6, 7 and 8.

Referring to FIG. 17, a flow chart 160 indicates the steps for implementing the virtual folding feature described in connection with FIGS. 6, 7 and 8 above. At a first step 162, a first view is selected. Selection of a view can include having a user specifically click on a view after actuating the virtual folding feature. Following the step 162 is a step 164 where a second view is selected. Just as with the first view, selected in the step 162, selecting the second view can include having a user click the mouse to highlight the second view after activating the virtual folding feature. Following step 164 is a step 166 where the system displays the views together. The step 166 may be implemented in a conventional fashion by using the two-dimensional drawing data for each of the views and by applying a transformation matrix to at least one of the views so that both views appear in proximity to each other on the computer screen. Note also that, if the two views are projections of one another, the views may be snapped to horizontal or vertical alignment in accordance with conventional drafting standards, such as ANSI or ISO.

Figure 18:
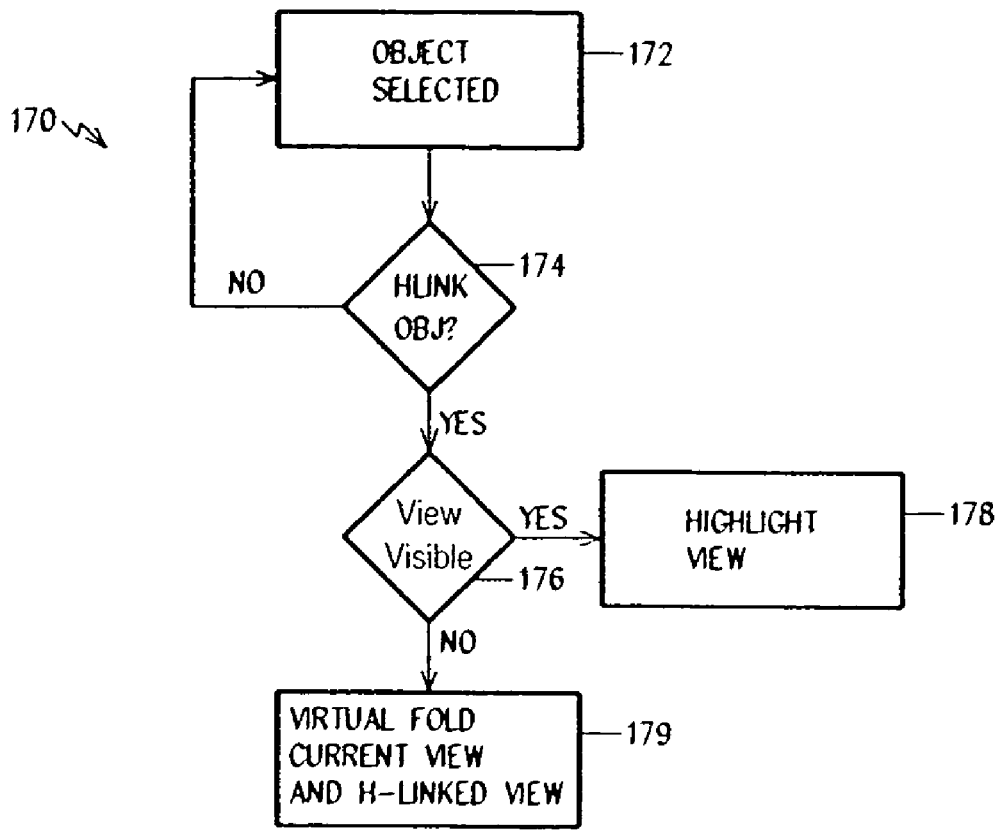
FIG. 18 is a flow chart that illustrates steps for hyperlinking a section line or detail circle of one view to another view corresponding to the section line or detail circle.

Referring to FIG. 18, a flow chart 170 illustrates steps for hyperlinking a section line or detail circle of one view to another view corresponding to the section line or detail circle. Processing begins at a first step 172 where an object in the current view is selected. Selecting the object at the step 172 may involve having the user point the mouse to the object and click on it in a conventional manner. Following step 172 is a test step 174 where it is determined if the object selected at the step 172 is a hyperlink object. Note that a hyperlink object includes objects that cause a hyperlink between two views, such as a section line or detail circle. As discussed above, the hyperlink information is stored with each of the views, so that determining if the selected object is a hyperlink object at the step 174 involves reviewing the hyperlink data to determine if the selected object corresponds to a hyperlink object. If it is determined at the step 174 that the selected object is not a hyperlink object, then control passes back to the step 172 to wait for selection of another object. Otherwise, if it is determined at the step 174 that the selected object is a hyperlink object, then control passes from the step 174 to a test step 176 where it is determined whether the view corresponding to the selected object is currently visible. If so, then control passes from the test step 176 to a step 178 where the view is highlighted in a conventional manner. Alternatively, if it is determined at the test step 176 that the view corresponding to the hyperlink is not currently visible, then control passes from the step 176 to a step 179 where the current view and the view corresponding to the hyperlink object are virtually folded so that the views appear together. Virtual folding is discussed above in connection with FIG. 17.

Figure 19:
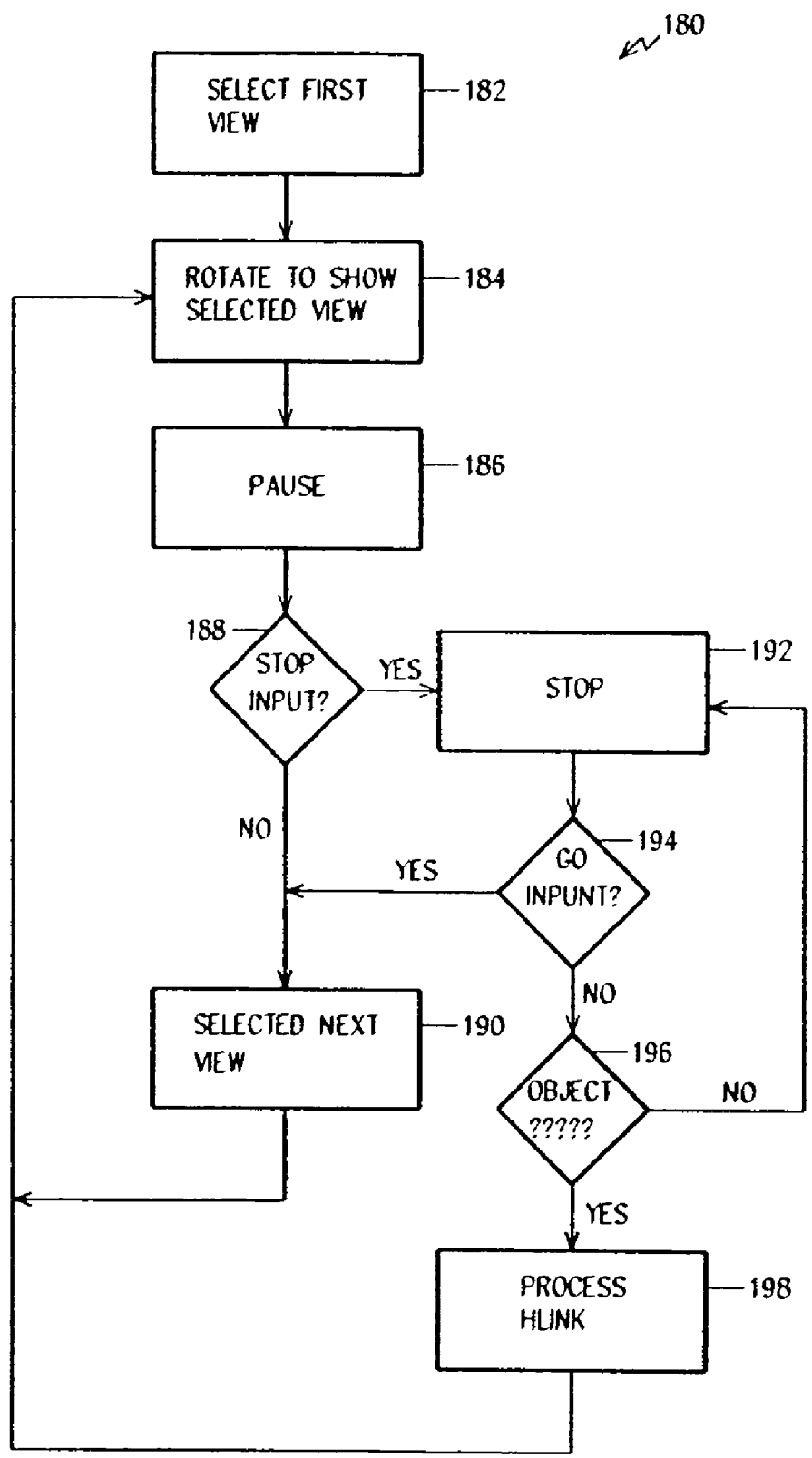
FIG. 19 is a flow chart that illustrates steps performed in connection with the animation feature.

Referring to FIG. 19, a flow chart 180 illustrates steps performed in connection with the animation feature discussed above. At a first step 182, a first view is selected, as discussed above. The animation iterates through each of the views by rotating a three-dimensional tessellated depiction of the model in the modeling window 40. There is no particular order required as to the selection of a view, except when hyperlinking is invoked, as discussed below.

Following step 182 is a step 184 where the three-dimensional model is rotated to present the selected view. In the case of section cut, the portion of the model that is in front of the section cut is removed so that the inside portion, where the section cut is taken, is shown. Following the step 184 is a step 186 where the animated model is paused to show the user the model with the selected view facing forward. Following the step 186 is a test step 188 where it is determined whether the user has input a stop command. The user may input a stop command at any time during the animation to stop the animation process and see a particular view. If it is determined at the test step 188 that a stop command has not been entered, then control passes from the step 188 to a step 190, where a new view is selected. Following the step 190, control passes back to the step 184 where the tessellated model is rotated to the newly selected view.

Note that rotation of a three-dimensional model, in particular rotation of a tessellated version of a three-dimensional model, is known in the art. Note also that it is possible to correlate the various two-dimensional views with particular orientation of the model using the transformation matrix associated with each view.

If it is determined at the test step 188 that a stop command has been entered by the user, the control passes from a step 188 to a step 192 where the animation stops. Once the animation stops, the view remains static and the three-dimensional model does not move. Following the step 192 is a test step 194, where it is determined if the user has clicked on the "go" button. If so, the control passes from a step 194 back to a step 190, where a new view is selected so that animation may continue. As discussed above, following step 190 is the step 184 where the tessellated model is rotated to the selected view.

If it is determined at the step 194 that the user has not selected the "go" button, then control passes from a step 194 to a step of 196, where it is determined whether the user has selected an object from the presented view. If an object is not selected, the control passes back to the step 192, discussed above. Otherwise, if it is determined at the test step 196 that an object has been selected (while the animation has been stopped, as determined in the step 188), then control passes from the step 196 to the step 198 where hyperlink processing is performed. As discussed above, hyperlink processing occurs when a selected object corresponds to a section view or a detail circle in one view that correlates to another view. If the user has stopped the animation and selected an object, then the step 198 is performed to determine whether a hyperlink and/or virtual folding view needs to be performed. Accordingly, the process of the step 198 corresponds to the process, discussed above, in connection with the processing of FIGS. 17 and 18. Following the step 198, control passes back to the step 184 to rotate the tessellated model to present the view indicated by the hyperlink and/or virtual folding view at the step 198.

Figure 20:
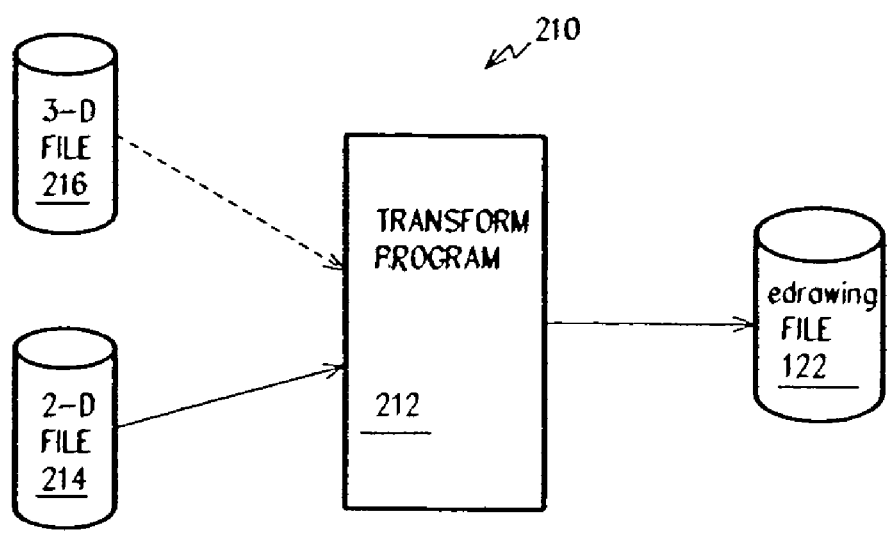
FIG. 20 is a schematic diagram illustrating a process in which a transform program creates the electronic drawing file using a two-dimensional file and, optionally, a three-dimensional file.

Referring to FIG. 20, a schematic diagram 210 illustrates a process in which a transform program 212 creates the electronic drawing file 122 using a two-dimensional file 214 and, optionally, a three-dimensional file 216. The two-dimensional file 214 may be a conventional two-dimensional file that is generated in a conventional manner using a solid modeling program. Many solid modeling programs, such as the Solid Works program, which is available from SolidWorks Corporation of Concord, Mass., have a built-in mechanism allowing the user to automatically generate a two-dimensional file, such as the two-dimensional file 214, that includes a plurality of two-dimensional views corresponding to the solid model created by the user. In addition to the conventional two-dimensional drawing commands and plurality of views, the two-dimensional file 214 may also contain the transform matrix for each of the views that orients each of the views with respect to the solid model. Thus, at least two of the components shown in FIG. 15 and described above, the two-dimensional data 142 and the transform matrix 144, are already provided in the two-dimensional file 214.

Some of the views in the conventional two-dimensional file 214 may be section cuts or detail circles of other views. In that case, that information would also be contained in the two-dimensional file 214, since such information may be generated from a solid model and from the portions of the solid model selected by the user for sectioning and for providing detail. Thus, the hyperlink information, or information which can easily be converted to hyperlink information, is also provided in the two-dimensional file 214. That is, the hyperlink data 146 shown in FIG. 15 may be provided in two-dimensional file 214 for a two-dimensional electronic drawing or, alternatively, information which may be easily converted to hyperlink data 146 in a conventional manner may be found in the two-dimensional file 214.

The tessellated view data 138 shown in FIG. 15 may be provided by the three-dimensional file 216 in a conventional manner. Note that many three-dimensional or solid modeling programs include a solid tessellated view of the model created by the user. Alternatively, when the two-dimensional file 214 is created by the modeling program, the tessellated view may be included therewith even though the tessellated view is not part of the two-dimensional views.

The transform program 212 takes the information from the two-dimensional file 214 and optionally, as discussed above, information from the three-dimensional file 216 and creates the electronic drawing file 122 having a format analogous to that shown in FIG. 15 and discussed above. Since most of the relevant information is already contained in the two-dimensional file 214 and, optionally, the three-dimensional file 216, the transform program 212 simply converts the format of the data in a conventional and straightforward manner to provide the proper format for the electronic drawing file 122.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

The invention claimed is:

1. A computer-implemented method for showing a relationship between at least two views of a three-dimensional model, comprising:
   defining a first object using a data structure containing a link between the first object and a second view;
   selecting the first object in a first view;
   executing the link between the first object and the second view;
   indicating the relationship between the first view and the second view; and
   wherein the link between the first object and the second view is determined by a presence in the second view of a second object that corresponds to the first object.

2. A method, according to claim 1, wherein the data structure containing the link between the first object and the second view identifies the first object and associates the first object with the second view.

3. A method, according to claim 1, wherein indicating comprises highlighting the first object and the second view.

4. A method, according to claim 3, wherein highlighting comprises at least one of changing color and shading.

5. A method, according to claim 1, wherein the second view is re-positioned to appear in closer proximity to the first view.

6. A method, according to claim 5, further comprising aligning the first view and the second view in accordance with a conventional drafting standard.

7. The method of claim 1 further comprising instructions to display the second one of the views on a computer screen in response to the second one of the views not being visible on the computer screen.

8. The method of claim 1 wherein the object includes at least one of coordinates of a view object, a section line, and a detail circle.

9. The method of claim 1 wherein the data structure that links the object to the second one of the views is derived from an underlying three-dimensional model data from which the first one of the views and the second one of the views are generated.

10. The method of claim 1 wherein selecting the object includes locating a cursor on the geometry and receiving user input generated by pressing a mouse button.

11. A data storage apparatus comprising instructions to configure a computer system to show a relationship between at least two views of a three-dimensional model, said instructions comprising instructions to:
    define a first object using a data structure containing a link between the first object and a second view;
    select the first object in a first view;
    execute the link between the first object and the second view;
    indicate the relationship between the first view and the second view;
    wherein the data structure containing the link between the first object and the second view identifies the first object and associates the first object with the second view; and
    wherein the link between the first object and the second view is determined by a presence in the second view of a second object that corresponds to the first object.

12. The apparatus of claim 11 wherein the instructions to indicate comprise instructions to highlight the first object and the second view.

13. The apparatus of claim 12 wherein the instructions to highlight comprise instructions to change a color or shading.

14. The apparatus of claim 11 wherein the second view is re-positioned to appear in closer proximity to the first view.

15. The apparatus of claim 14 further comprising instructions to align the first view and the second view in accordance with a conventional drafting standard.

* * * * *